(12) United States Patent
Silvestri

(10) Patent No.: US 7,184,329 B2
(45) Date of Patent: Feb. 27, 2007

(54) ALIGNMENT OF MEMORY READ DATA AND CLOCKING

(75) Inventor: Paul A Silvestri, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 78 days.

(21) Appl. No.: 10/888,195

(22) Filed: Jul. 8, 2004

(65) Prior Publication Data

US 2006/0007759 A1    Jan. 12, 2006

(51) Int. Cl.
*G11C 7/00* (2006.01)
(52) U.S. Cl. .................. 365/194; 365/189.05; 365/233
(58) Field of Classification Search ................ 365/194, 365/189.05, 233
See application file for complete search history.

(56) References Cited

U.S. PATENT DOCUMENTS

| | | | |
|---|---|---|---|
| 6,385,129 B1 | 5/2002 | Silvestri | |
| 6,768,697 B2 | 7/2004 | Labrum et al. | |
| 6,789,137 B2 * | 9/2004 | Itoh | ............................ 710/14 |
| 6,850,459 B2 * | 2/2005 | Suzuki | ....................... 365/233 |
| 6,900,685 B2 | 5/2005 | Silvestri | |
| 6,920,081 B2 | 7/2005 | Labrum et al. | |
| 2001/0050856 A1 * | 12/2001 | Matsuzaki | ..................... 365/1 |

* cited by examiner

*Primary Examiner*—Hoai Ho
(74) *Attorney, Agent, or Firm*—Fish & Neave IP Group of Ropes & Gray LLP; Jeffrey H. Ingerman; Chia-Hao La

(57) ABSTRACT

Circuits and methods are provided for aligning data read from a memory with an output clock signal when the memory is operated at very high clock frequencies. To align data and clock signals when needed, delay is added to the output clock signal during the read operation. This alignment allows various timing specifications to be met when they would otherwise be violated, therefore improving data integrity in the system.

31 Claims, 14 Drawing Sheets

ALIGNMENT OF MEMORY READ DATA AND CLOCKING

BACKGROUND OF THE INVENTION

This invention relates to integrated circuit memories. More particularly, this invention relates to the timing of data and clock signals of read operations in dynamic random access memories (DRAMs).

A DRAM is a form of semiconductor random access memory (RAM) commonly used as main memory in computers and other electronic systems. DRAMs store information in arrays of integrated circuits that include capacitors. High speed DRAMs, known as synchronous DRAMs (SDRAMs), use clocks to synchronize control and data signal transfers.

SDRAMs often transmit a clock signal along with the data produced from a read request. The clock signal is used by the receiving circuitry to determine when to sample the incoming data. In order to ensure accurate sampling, the data and output clock signals must satisfy certain timing specifications. Two important specifications are t_first and t_last.

The t_first specification defines the time between an output clock edge and the first bit transition on the data bus. This value is restricted to a range greater than a certain value, where the value depends on the size of the output clock period (t_clk). In a double data rate (DDR) system, where data transitions occur on both the rising and falling edges of the output clock, the optimal sampling time is the midpoint between two consecutive clock edges. Therefore, meeting the t_first specification ensures that a data transition occurs sufficiently after a first optimal sampling time.

In contrast, the t_last specification defines the time between an output clock edge and the last bit transition on the data bus. This value is usually restricted to a certain fixed range, e.g., less than 300 picoseconds. Meeting the t_last specification ensures that a data transition occurs sufficiently before a second optimal sampling time.

Assuming a DDR SDRAM system, the ideal timing scenario would have data transitions perfectly time-aligned with the output clock edges. In this ideal case, t_first would be t_clk/2 and t_last would be 0. If the data transitions occurred sufficiently after their corresponding clock edges, the t_first specification would be met, but the t_last specification might be violated. On the other hand, if the data transitions occurred sufficiently before their corresponding clock edges, the t_last specification would be met, but the t_first specification might be violated. Therefore, in a real-world system where some amount of skew is inevitable, meeting both specifications typically involves a tradeoff.

A problem arises when the output clock frequency is increased. As the clock period becomes shorter, meeting the t_first and t_last specifications becomes more difficult. In particular, the physical delay associated with outputting data from an array, referred to as t_delay, often becomes a limiting factor.

Normally, there is a certain latency, referred to as t_lat, involved in memory read operations. t_lat is defined as the amount of time between the start of a read instruction and the first valid edge of the output clock. Typically, t_lat is a certain multiple of the clock period, such as 2*t_clk.

Ideally, t_delay should be less than t_lat, so the outgoing data is latched until the first output clock edge. At that edge, the data is output onto the final data bus, resulting in substantially simultaneous signal transitions. However, if t_delay is greater than t_lat, as can happen when t_clk is very short, the data will be output as soon as it is ready, which can be skewed from the output clock edge by a significant amount. When that happens, it is quite possible to violate either the t_first or the t_last specification, or even both.

In view of the foregoing, it would be desirable to align an output clock with associated data when t_delay is greater than t_lat in order to ensure more reliable compliance with timing specifications. This permits more robust data retrieval and contributes to overall system reliability.

SUMMARY OF THE INVENTION

In accordance with this invention, circuitry and methods are provided that align an output clock with associated data when t_delay is greater than t_lat. In an exemplary embodiment of the invention, a circuit is introduced into the output clock path. This circuit is designed to track t_delay and introduce a matching delay into the output clock path when needed. This forces the output clock to transition at the same time as the outgoing data.

In many known memory devices, t_delay is caused partly by analog sense amplifier circuitry, which amplifies small voltage signals to comply with power source voltage levels. Tracking circuits of the invention may comprise similar sense amplifier circuitry in order to provide a matching delay.

The invention therefore advantageously tracks the value of t_delay and introduces a corresponding delay into the output clock path when appropriate. This adjustment improves system reliability by facilitating accurate data retrieval from the SDRAM.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
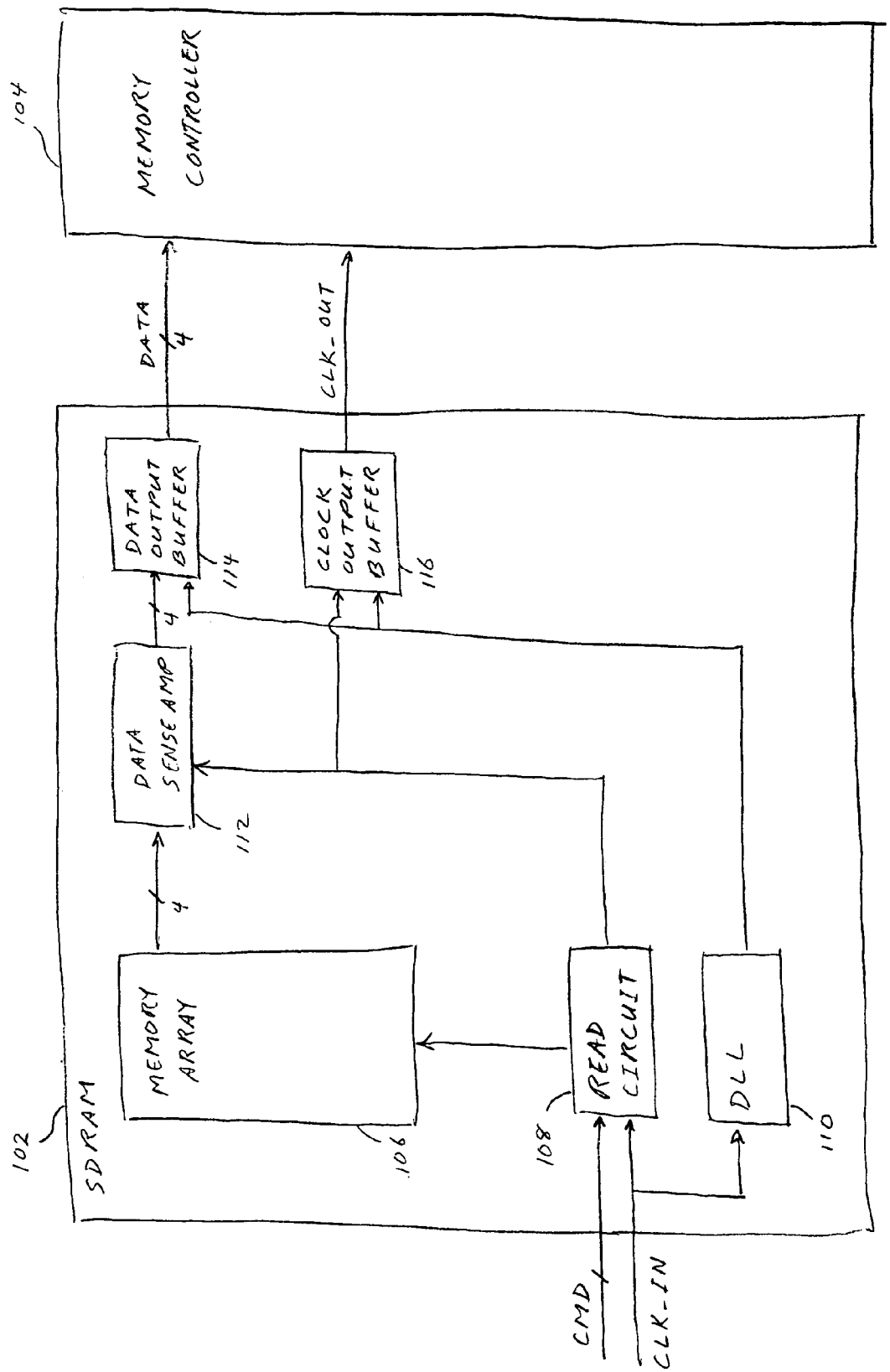
FIG. 1 is a block diagram of a typical SDRAM architecture.

FIG. 1 shows a typical SDRAM architecture. It comprises an SDRAM 102 and a memory controller 104. SDRAM 102 includes a memory array 106, read circuit 108, and delay locked loop (DLL) 110. Read circuit 108 and DLL 110 accept external clock signal CLK_IN. At each edge of CLK_IN, read circuit 108 examines the contents of incoming bus CMD, and determines whether a memory operation (e.g., a read or a write) is required. If so, it communicates the necessary information to memory array 106 for execution. This information can include, for example, a read command and a memory address. DLL 110 generates a clock signal with the same frequency as CLK_IN, whose phase is locked to that of CLK_IN.

If a read operation is requested by read circuit 108, memory array 106 will send the appropriate data to data sense amp 112. A word of data can include any number of bits, such as 4, 8, 16, or 32. The embodiment shown in FIG. 1 uses a 4-bit data bus. Data sense amp 112 amplifies the received data to a suitable voltage level, usually determined by the power supply voltage. Thereafter, the amplified data is transmitted to data output buffer 114, which stores the data in a memory element, such as a latch. When data output buffer 114 receives a valid clock transition from DLL 110, it sends the data to memory controller 104 by way of signal DATA. When a read operation is requested by read circuit 108, clock output buffer 116 transmits signal CLK_OUT to memory controller 104. Controller 104 uses CLK_OUT to determine when to sample data values from signal DATA. Transitions of signal CLK_OUT are determined by the output of DLL 110.

Figure 2:
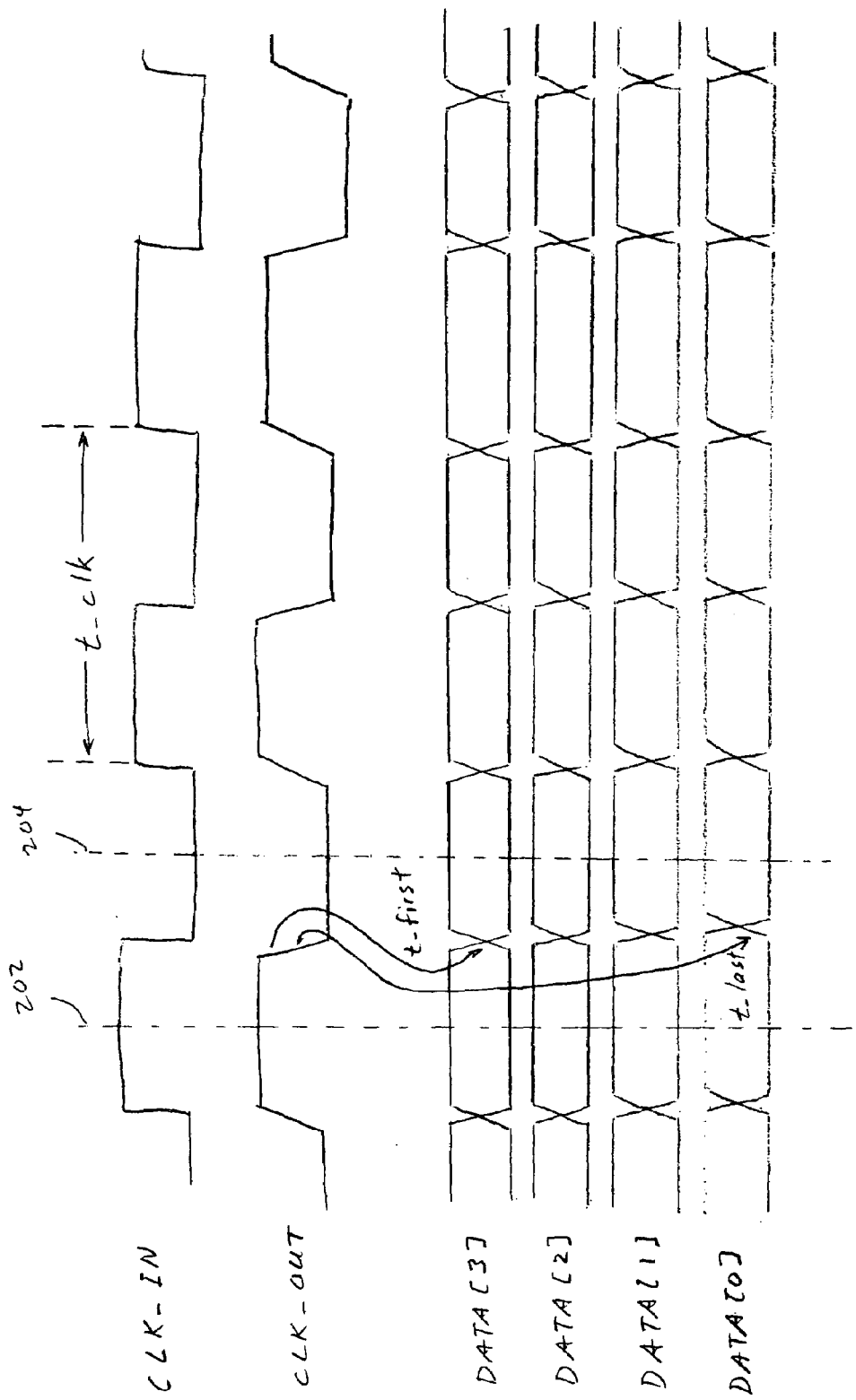
FIG. 2 is a timing diagram illustrating various timing parameters of the SDRAM of FIG. 1.

FIG. 2 shows several signals relevant to the invention. CLK_IN is the external clock transmitted to SDRAM chip 102. CLK_OUT is the output of clock output buffer 116. As shown, CLK_OUT transitions at substantially the same times as signal CLK_IN. DATA[3] through DATA[0] are the four bits transmitted through data output buffer 114. Assuming a DDR system, DATA[3] through DATA[0] will transition at both rising and falling clock edges. In the example shown, DATA[3] tends to be the first bit signal to transition in a given cycle, while DATA[0] is the last to transition.

The waveforms illustrate several timing parameters relevant to the invention. For example, t_clk is the period of one cycle of CLK_IN, and equivalently, one cycle of CLK_OUT. t_first is the time measured from an edge of CLK_OUT to the first DATA transition corresponding to that edge. As shown, the first transition occurs on signal DATA[3]. If the first DATA transition is before the relevant edge of CLK_OUT, then t_first will have a negative value. In contrast, t_last is the time measured from an edge of CLK_OUT to the last DATA transition corresponding to that edge. In this example, the last transition occurs on DATA[0]. If the last DATA transition is before the relevant edge of CLK_OUT, then t_last will have a negative value.

The optimal time for memory controller 104 to sample the bus DATA is halfway between consecutive edges of CLK_OUT, for instance at times 202 and 204. Because it is desirable for the DATA signals to be as stable as possible around these sampling times, restrictions are placed on t_first and t_last to ensure data signal integrity.

The time t_first is usually specified as being greater than a certain value, where the value depends on t_clk. Satisfying this specification ensures that there are no DATA transitions immediately after DATA is sampled, such as at time 202. On the other hand, t_last is usually specified as being less than a certain fixed value, which is independent of t_clk. Satisfying this specification ensures that there are no DATA transitions immediately before DATA is sampled, such as at time 204.

These two specifications, however, can result in conflicting conditions between CLK_OUT and DATA. For example, FIG. 2 shows all DATA transitions occurring at or slightly after the corresponding edge of CLK_OUT. In this case, the t_first specification is easily satisfied, and there is ample time between DATA sampling and the first subsequent DATA transition. However, the t_last specification may be violated if the DATA transitions drift too far after the CLK_OUT edge. Conversely, when DATA transitions occur slightly before the corresponding CLK_OUT edge, the t_last specification is easily satisfied, but the t_first specification may be violated. Therefore, a tradeoff is involved and care must be taken to satisfy both specifications by having the DATA transitions aligned with the CLK_OUT edges as precisely as possible.

Figure 3:
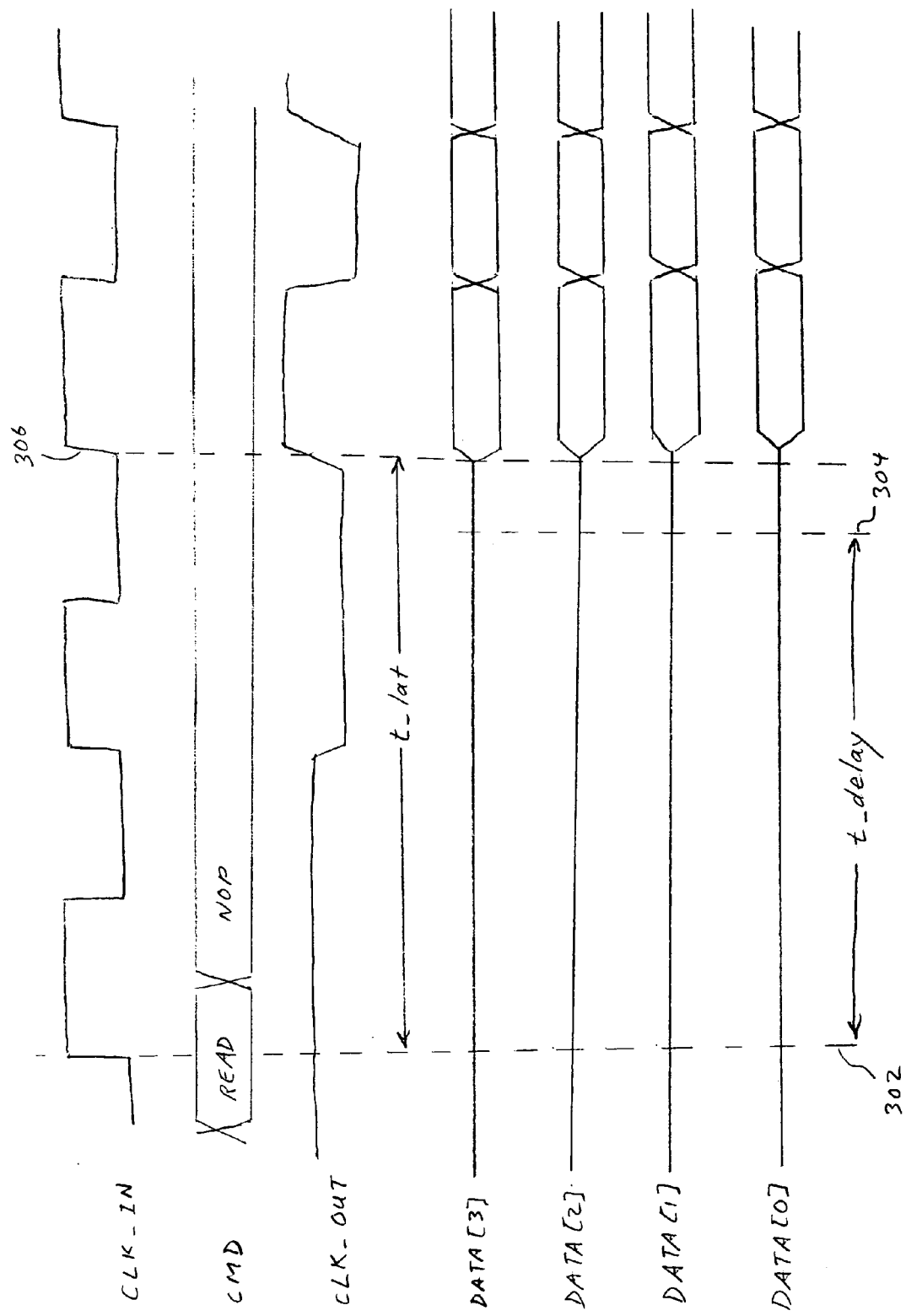
FIG. 3 is a timing diagram illustrating a typical read operation.

FIG. 3 shows the timing of a typical read operation. Note that signal bus CMD is included, along with the signals shown in FIG. 2. At time 302, read circuit 108 observes a READ command on the CMD bus. At this time, both CLK_OUT and DATA have undefined values. A read request is transmitted to memory array 106, which returns the appropriate data. The data is passed through data sense amp 112 and into data output buffer 114, where it is latched. The time that elapses during this process is referred to as t_delay. As shown in FIG. 2, t_delay has a value of less than 2*t_clk.

Similarly, there is a certain amount of latency involved in generating a suitable CLK_OUT transition. This latency, referred to as t_lat, is often a fixed multiple of t_clk. FIG. 3 illustrates a t_lat of 2*t_clk. Thus, two full clock cycles elapse from the detection of a read request (at time 302) to the first valid transition of CLK_OUT (at time 306). When this transition occurs, data output buffer 114 transmits its stored data to memory controller 104, and the transitions of DATA are substantially aligned with the corresponding edge of CLK_OUT. Thus, as long as t_delay is less than t_lat, data output buffer 114 will be able to output DATA in response to receiving an edge of CLK_OUT.

Figure 4:
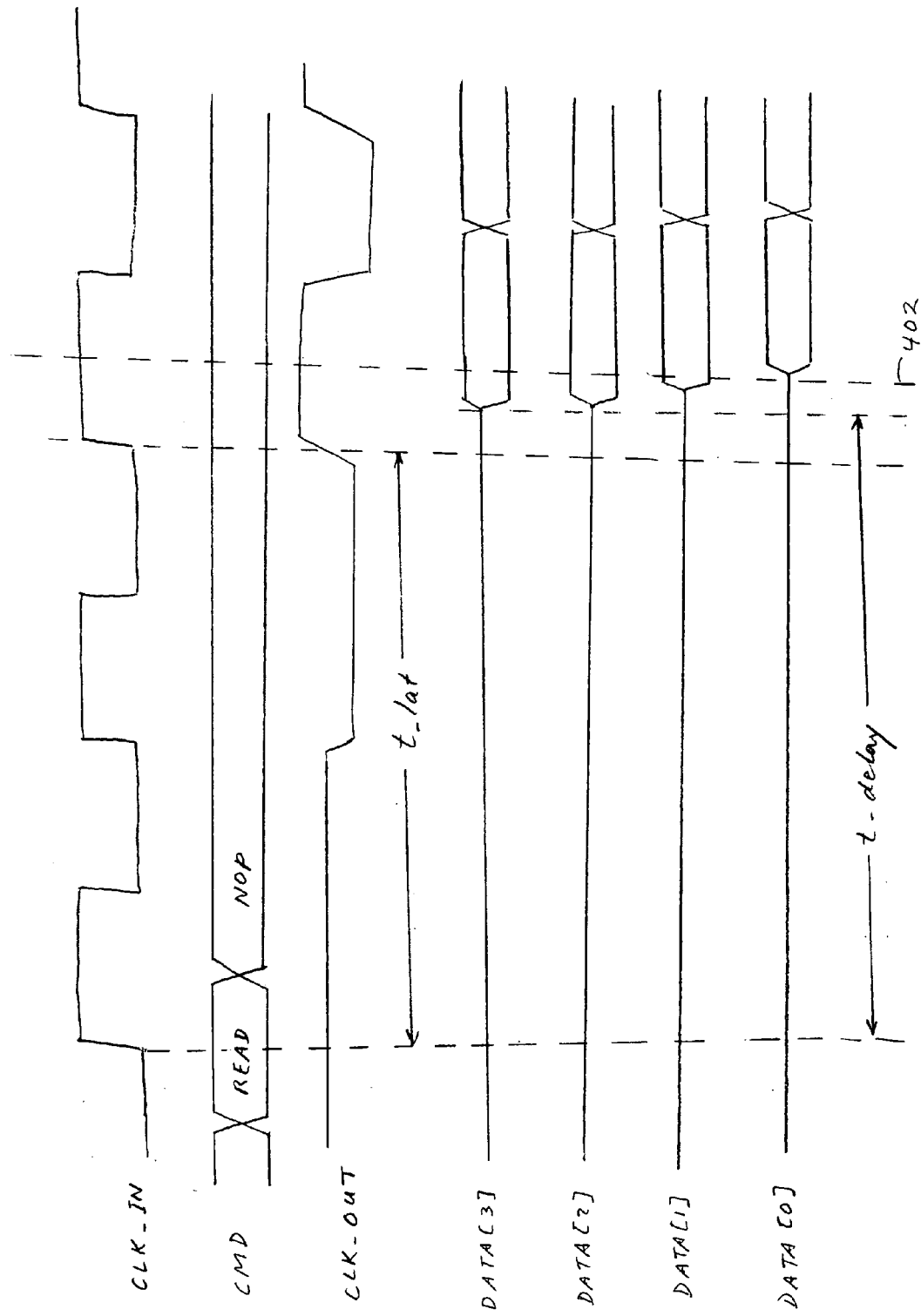
FIG. 4 is a timing diagram illustrating a faulty read operation with a short clock period.

FIG. 4 shows another read request, involving the same signals as FIG. 3. However, in this case t_clk has been shortened, for example, to increase the rate of data throughput. As a result, t_lat is scaled down by a corresponding amount. In fact, t_lat is reduced to an amount shorter than t_delay, which does not vary with t_clk. Thus, data output buffer 114 receives the first valid edge of CLK_OUT before it receives any data, and opens its latch in response to that edge. As a result, DATA will transition as soon as the appropriate data arrives from the memory array without waiting for a clock edge. As shown in FIG. 4, this results in a large skew between signals CLK_OUT and DATA. In particular, transitions of DATA occur very close to sampling time 402, and both the t_first and the t_last specifications are violated. In other examples, the transitions of DATA might violate only one (or neither) of the t_first and t_last specifications. This unpredictability leads to reduced data integrity in the system.

Figure 5:
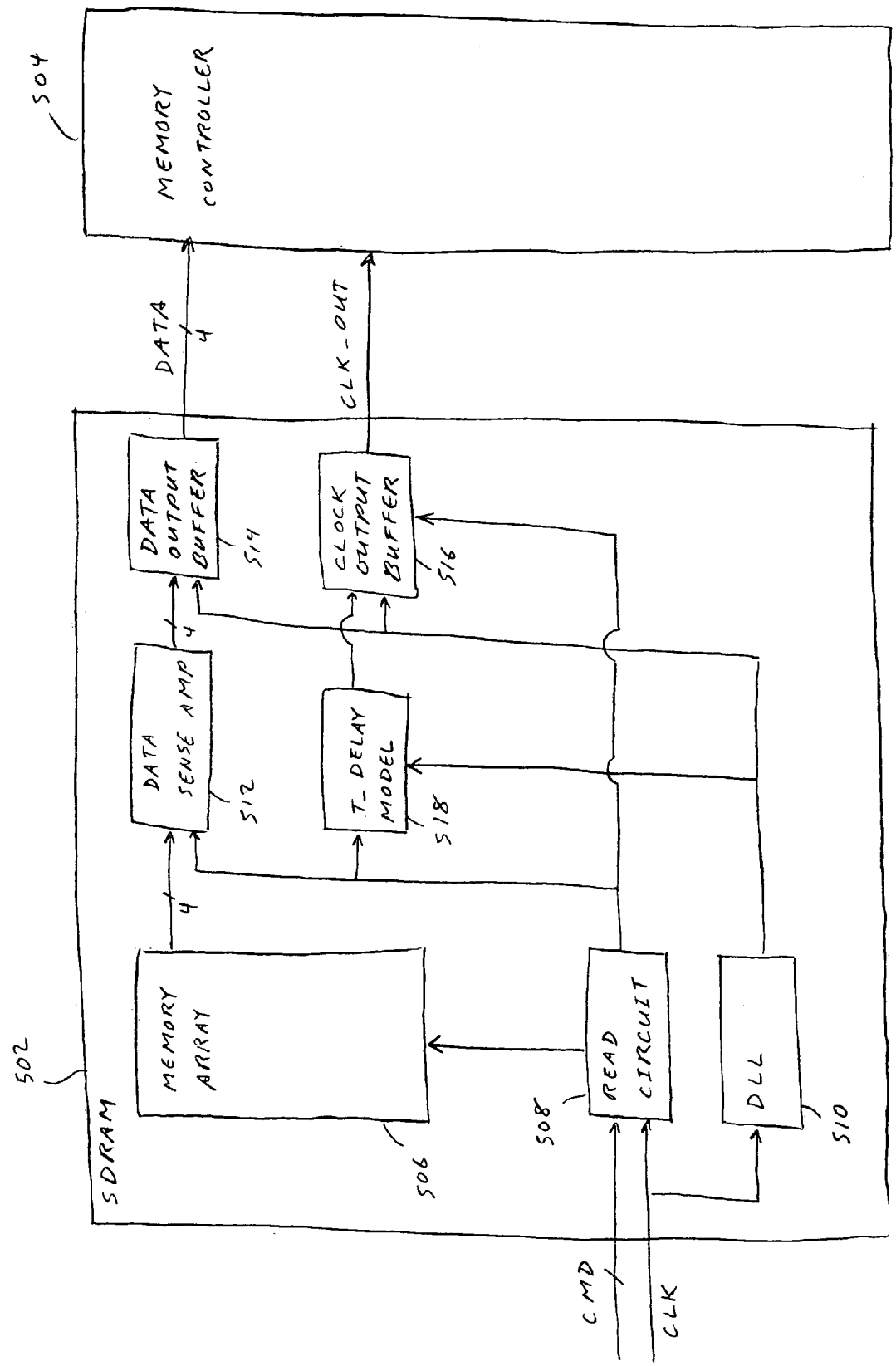
FIG. 5 is a block diagram of an illustrative SDRAM architecture in accordance with the invention.

FIG. 5 shows an SDRAM architecture in accordance with the invention. It comprises SDRAM 502 and memory controller 504. SDRAM 502 includes memory array 506, read circuit 508, DLL 510, data sense amp 512, data output buffer 514, and clock output buffer 516. In addition, SDRAM 502 includes a t_delay model 518 in accordance with the invention, placed between read circuit 508 and clock output buffer 516. This t_delay model introduces a delay comparable to that of memory array 506 and data sense amp 512 during a read transaction. In a preferred embodiment, t_delay model 518 includes data sense amp circuitry similar to that of data sense amp 512.

Figure 6:
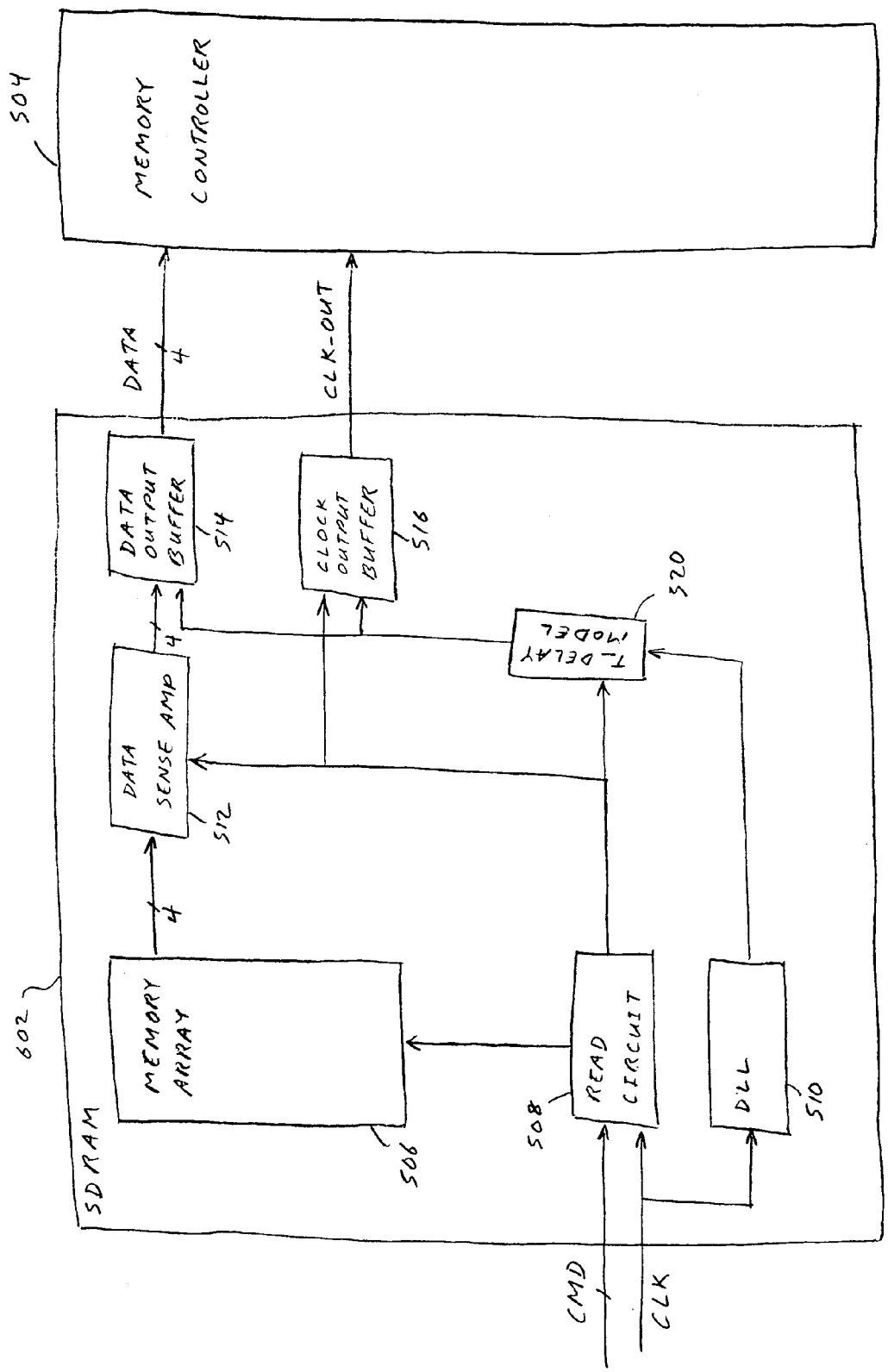
FIG. 6 is a block diagram of another illustrative SDRAM architecture in accordance with the invention.

FIG. 6 shows another SDRAM architecture in accordance with the invention. It comprises SDRAM 602 and memory controller 504. SDRAM 602 includes memory array 506, read circuit 508, DLL 510, data sense amp 512, data output buffer 514, clock output buffer 516, and t_delay model 520. In this embodiment, t_delay model 520 is placed between DLL 510 and clock output buffer 516. Thus, signal CLK_OUT is shifted when appropriate by delaying the output of DLL 510.

Figure 7:
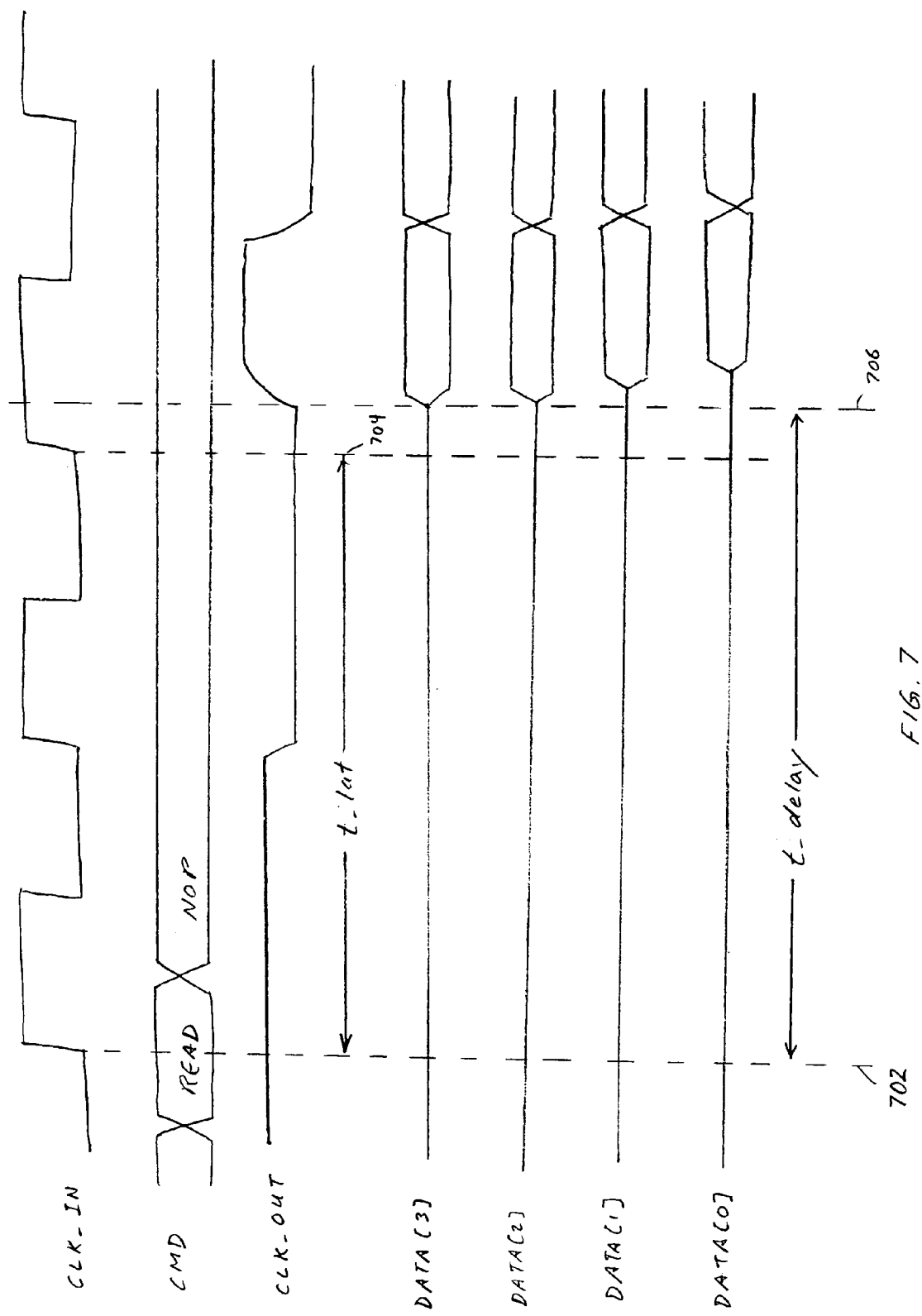
FIG. 7 is a timing diagram illustrating a corrected read operation in accordance with the invention.

FIG. 7 illustrates the timing of a read operation that incorporates the invention. As in FIG. 4, t_clk is sufficiently short so that t_lat is less than t_delay. Recall that without the invention, CLK_OUT would transition at time 704, two clock periods after the start of the read operation at time 702. However, because of the delay introduced by t_delay model 518, CLK_OUT now produces its first edge at time 706, substantially time-aligned with the first transition of DATA. Therefore, CLK_OUT and DATA are effectively synchronized with each other, and are not in danger of violating the t_first and t_last specifications. As a result, memory controller 504 can reliably receive data from the SDRAM.

Note that as a result of the invention, CLK_OUT may not be phase-aligned with CLK_IN. This shifting of CLK_OUT may be undesirable, and indeed may violate other timing specifications not discussed. However, because the signal CLK_OUT is used mainly as a reference for memory controller 504, its relationship with CLK_IN is considered less important than its relationship with DATA.

Figure 8:
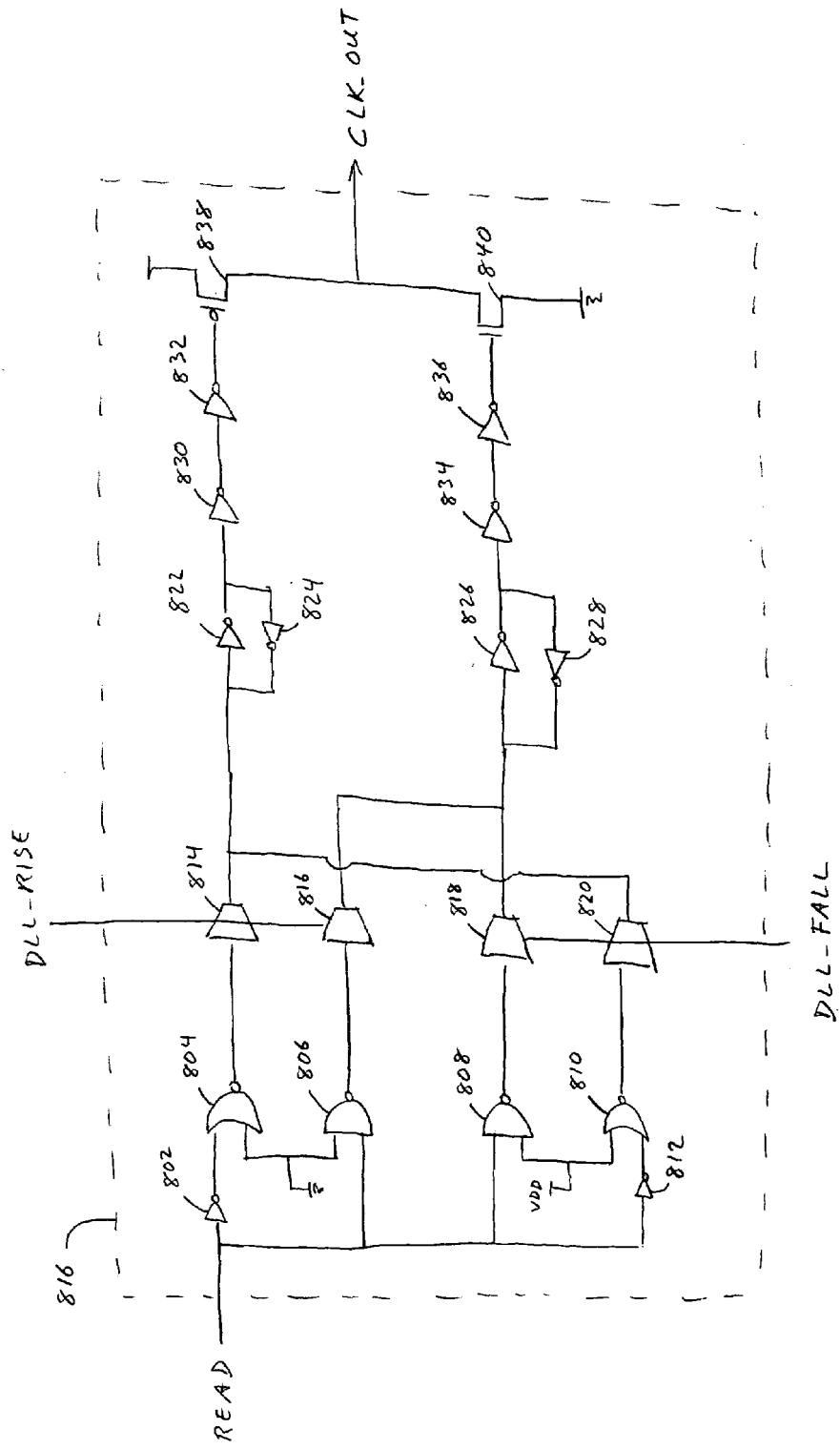
FIG. 8 is a circuit diagram of a typical clock output buffer.

FIG. 8 shows the structure of a typical clock output buffer 816, which may be used as clock output buffer 116 of FIG. 1. Clock output buffer 816 includes inverter 802, NOR gate 804, NAND gate 806, NAND gate 808, NOR gate 810, inverter 812, transmission gates 814, 816, 818, and 820, inverters 822, 824, 826, 828, 830, 832, 834, and 836, PMOS transistor 838, and NMOS transistor 840.

Inverters 802 and 812 accept input signal READ from read circuit 108. Signal READ is usually a logical 1 when a read command has been issued and a logical 0 otherwise. Note that one input of respective gates 804 and 806 is tied to logical 0 (GND), while one input of respective gates 808 and 810 is tied to logical 1 (Vdd). These connections emulate corresponding connections in data output buffer 114. The corresponding nodes in data output buffer 114 are connected to differential output signals of data sense amp 112. These signals may be sent through parasitic routing before reaching data output buffer 114.

Input signal DLL_RISE is applied to transmission gates 814 and 816, rendering the gates active when DLL_RISE is high. DLL_RISE pulses high when the output of DLL 110 undergoes a rising transition. Similarly, input signal DLL_FALL is applied to transmission gates 818 and 820 and pulses high when the output of DLL 110 undergoes a falling transition.

When input READ is low, the output of NOR gate 804 is low, the output of NAND gate 806 is high, the output of NAND gate 808 is high, and the output of NOR gate 810 is low. Thus, when either DLL_RISE or DLL_FALL pulse high, activating the corresponding transmission gates, a logical 1 is applied to the gate of PMOS transistor 838 and a logical 0 is applied to the gate of NMOS transistor 840. In other words, both transistors are rendered nonconductive, and output signal CLK_OUT takes on an undefined value.

When signal READ is high, the outputs of NOR gate 804 and NAND gate 806 are also high, while the outputs of NAND gate 808 and NOR gate 810 are both low. If DLL_RISE pulses high, activating transmission gates 814 and 816, PMOS transistor 838 is rendered conductive and NMOS transistor 840 is rendered nonconductive, yielding a CLK_OUT value of logical 1. Inversely, if DLL_FALL pulses high, activating transmission gates 818 and 820, PMOS transistor 838 is rendered nonconductive and NMOS transistor 840 is rendered conductive, yielding a CLK_OUT value of logical 0.

Figure 9:
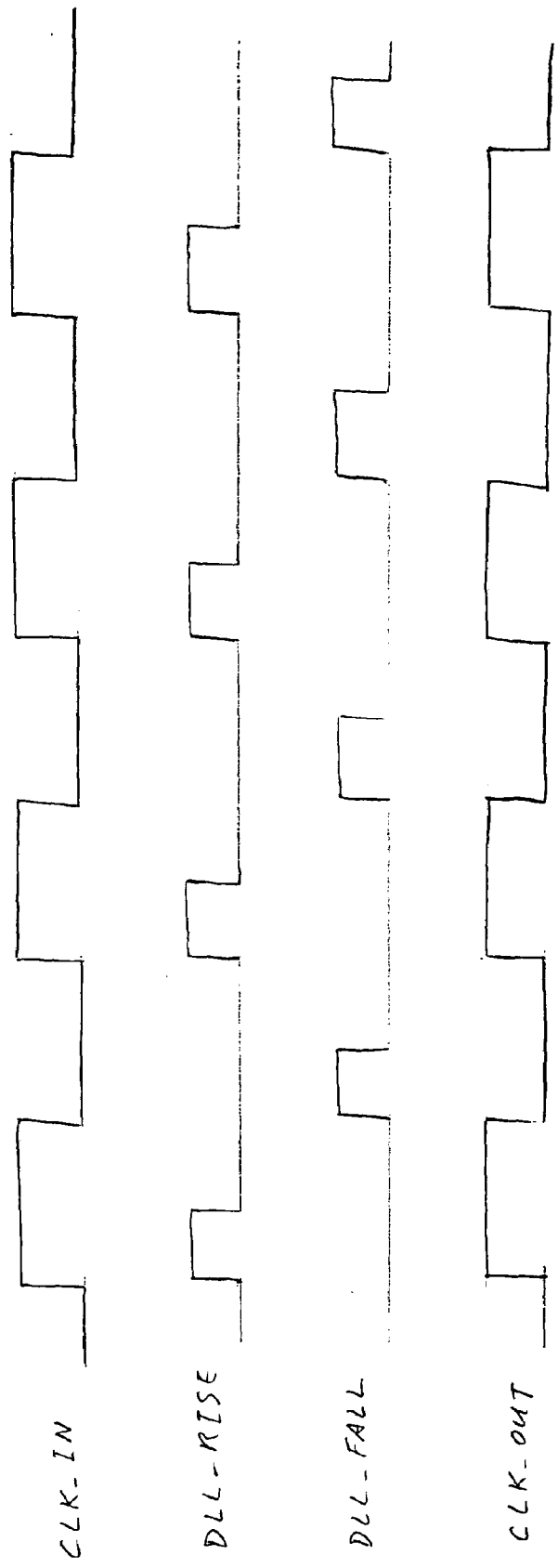
FIG. 9 is a timing diagram illustrating the operation of the clock output buffer of FIG. 8.

FIG. 9 is a timing diagram illustrating the operation of clock output buffer 816 when input signal READ is high. Signal CLK_IN is the external input clock, to which the output of DLL 110 is substantially phase-aligned. DLL_RISE pulses high when CLK_IN undergoes a rising transition and DLL_FALL pulses low when CLK_IN undergoes a falling transition. In one embodiment, the pulses of DLL_RISE and DLL_FALL have a width that is slightly less than ¼ t_clk (or equivalently, ½ of a clock pulse width). As shown, signals DLL_RISE and DLL_FALL generate a CLK_OUT signal with a frequency and phase that are substantially equal to those of signal CLK_IN.

Figure 10:
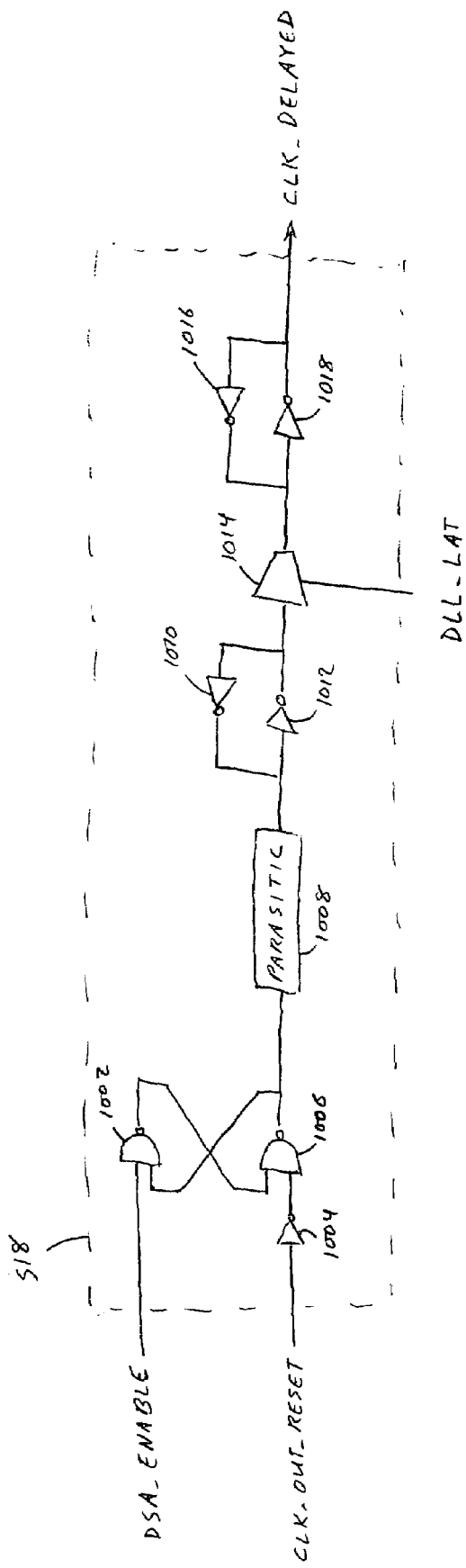
FIG. 10 is a circuit diagram of an illustrative t_delay model in accordance with the invention.

FIG. 10 shows an exemplary embodiment of t_delay model 518 according to the invention. T_delay model 518 includes NAND gate 1002, inverter 1004, NAND gate 1006, parasitic circuit 1008, inverters 1010 and 1012, transmission gate 1014, and inverters 1016 and 1018. Parasitic circuit 1008 may include capacitors, resistors, and the like, introducing a delay that is substantially equal to that undergone by signal DATA as it passes out of memory array 106 and through data sense amp 112. In one embodiment, parasitic circuit 1008 may include sense amplification circuitry.

T_delay model 518 accepts input signals DSA_ENABLE, CLK_OUT_RESET, and DLL_LAT. Signal DSA_ENABLE corresponds to a signal that enables data sense amp 512. Signal CLK_OUT_RESET pulses high in response to the end of a DLL_RISE pulse. Signal DLL_LAT corresponds to a signal used in the path of signal DATA, which is at least partly responsible for the latency t_lat described above. Note that inputs DSA_ENABLE and DLL_LAT are used to emulate timing constraints experienced by signal DATA. This effectively aligns CLK_OUT and DATA in accordance with the invention.

When input signal CLK_OUT_RESET pulses high, the output of NAND gate 1006 goes high. Thus, when DLL_LAT pulses high, output CLK_DELAYED takes on a value of logical 1. After the CLK_OUT_RESET pulse has passed, CLK_OUT_RESET returns to a low state. If DSA_ENABLE subsequently pulses low, rendering the output of NAND gate 1002 high, then both inputs of NAND gate 1006 are high, resulting in a gate output of low. When a DLL_LAT pulse is received, output CLK_DELAYED takes on a value of logical 0. Then, a high pulse on CLK_OUT_RESET may be used to pull the value of CLK_DELAYED high, while a low pulse on DSA_ENABLE may be used to pull the value of CLK_DELAYED low.

Figure 11:
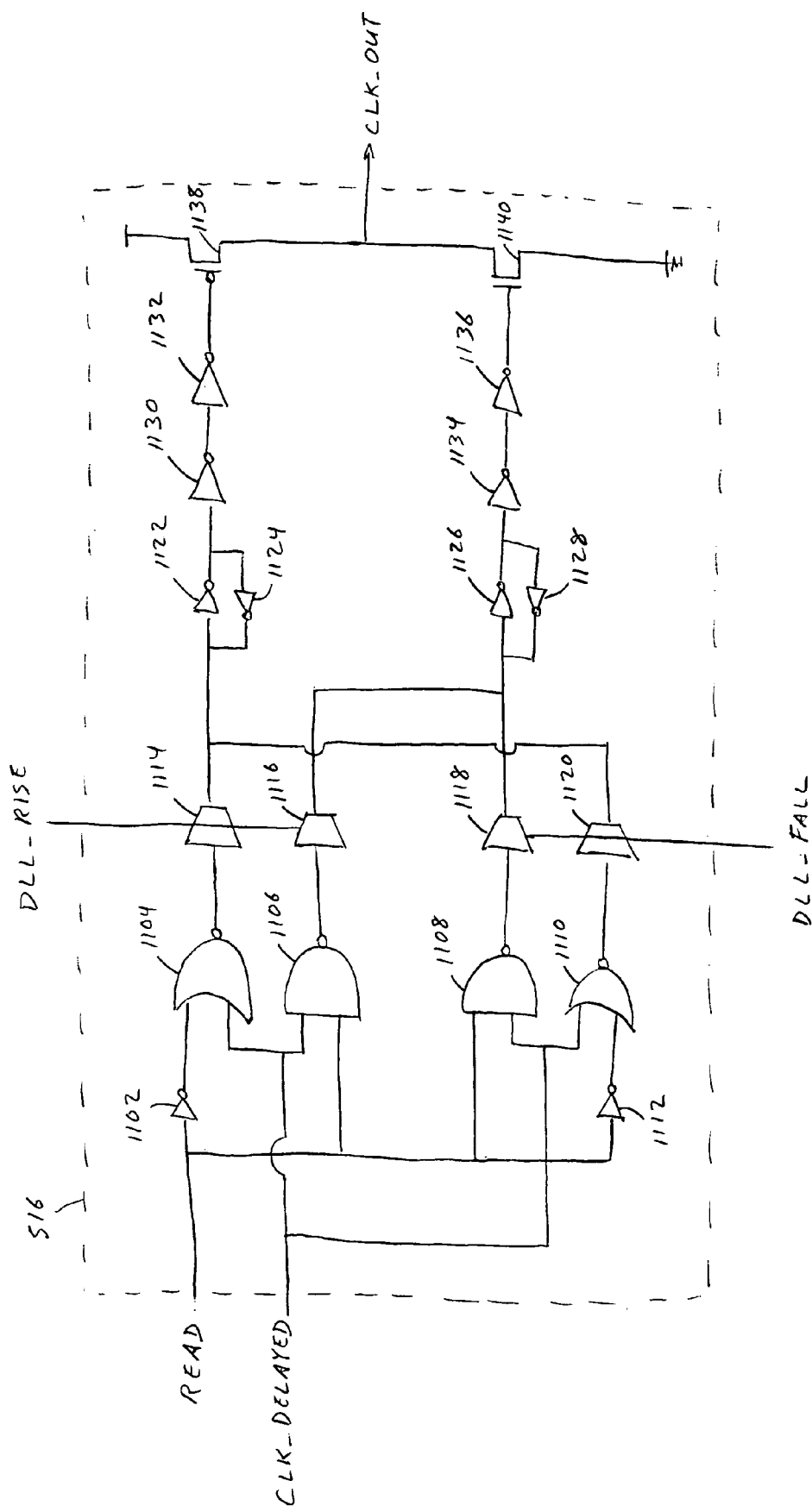
FIG. 11 is a circuit diagram of an illustrative clock output buffer in accordance with the invention.

FIG. 11 shows the structure of an exemplary embodiment of clock output buffer 516 according to the invention. Clock output buffer 516 is substantially similar to clock output buffer 816, and analogous circuit elements have reference numbers that differ by 400. The main structural differences between the two circuits relate to the use of signal CLK_DELAYED. The input of NOR gate 1104 and the input of NAND gate 1106 that were previously tied to GND are now tied to signal CLK_DELAYED. Similarly, the input of NAND gate 1108 and the input of NOR gate 1110 that were previously tied to Vdd are also tied to signal CLK_DELAYED. All other connections are substantially identical between the two circuits.

As before, a READ value of logical 0 results in an undefined CLK_OUT value, given an appropriate pulse of DLL_RISE or DLL_FALL. However, now a READ value of logical 1 will yield one of two scenarios, depending on the value of CLK_DELAYED. If CLK_DELAYED is low, then the output of all four logic gates 1104, 1106, 1108, and 1110 will be high. Thus, a pulse of DLL_RISE or DLL_FALL will result in a CLK_OUT value of logical 1. On the other hand, if CLK_DELAYED has a value of logical 1, all four logic gates 1104, 1106, 1108, and 1110 will output a logical 0. In this second scenario, a pulse of DLL_RISE or DLL_FALL will result in a CLK_OUT value of logical 0. Thus, switching CLK_DELAYED to one logical value results in switching CLK_OUT to the opposite logical value.

Figure 12:
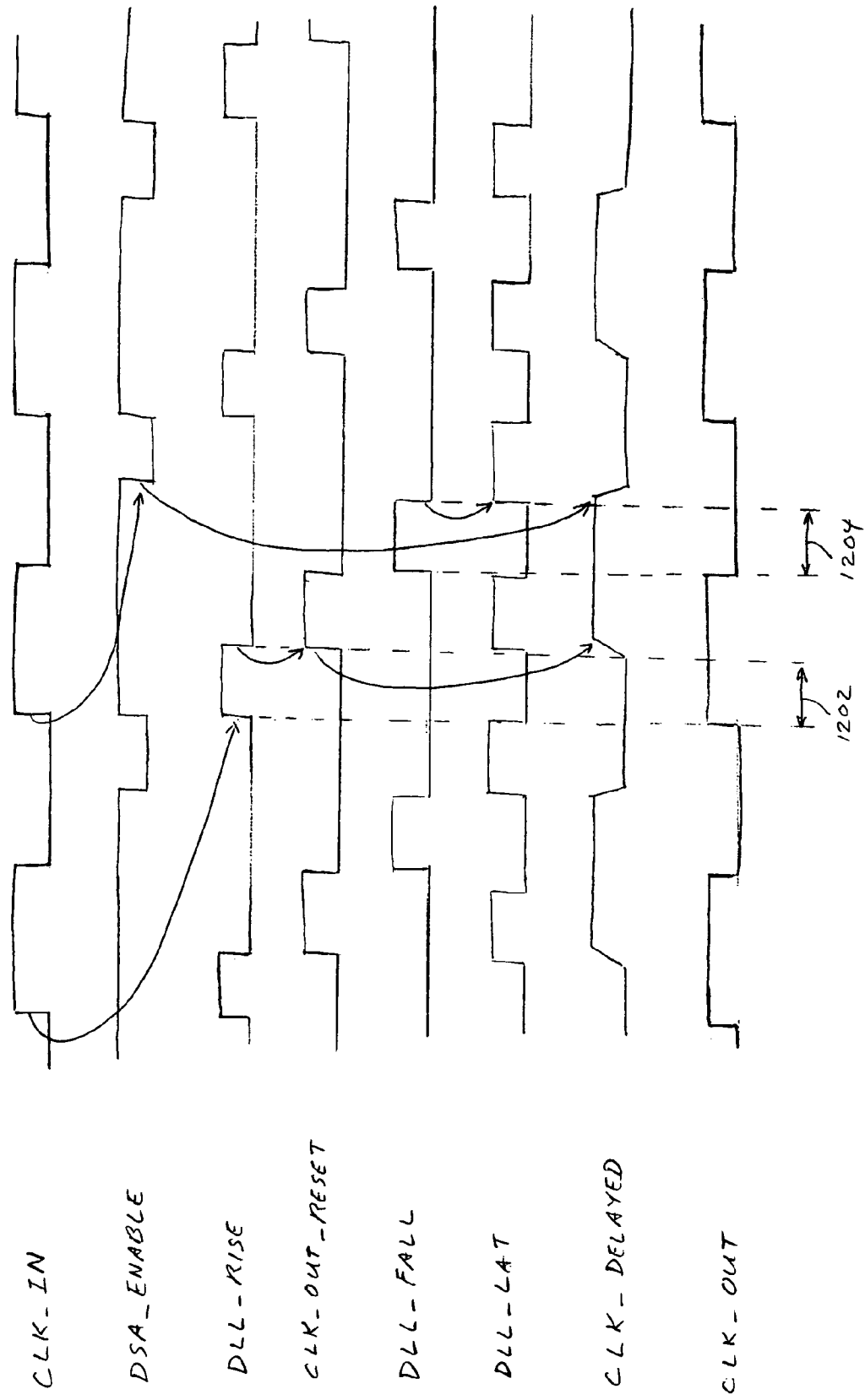
FIG. 12 is a timing diagram illustrating operation of the invention with a relatively low clock frequency.

FIG. 12 illustrates the operation of signals in FIGS. 10 and 11 with a relatively low CLK_IN frequency. As before, all pulses (e.g., of signals DSA_ENABLE, DLL_RISE, CLK_OUT_RESET, DLL_FALL, and DLL_LAT) preferably have a width of slightly less than ¼ t_clk (or equivalently, ½ of a clock pulse width). Also, recall that the output of DLL 510 is substantially aligned in frequency and phase with signal CLK_IN.

A rising edge of signal CLK_IN will generate a high pulse of signal DLL_RISE. The end of that pulse will generate a pulse of signal CLK_OUT_RESET which, as described above, results in a CLK_DELAYED value of logical 1. A rising edge of signal CLK_IN also generates a low pulse on signal DSA_ENABLE which, as described above, results in a CLK_DELAYED value of logical 0. Thus, signal CLK_DELAYED has a substantially similar frequency to signal CLK_IN, but is delayed in phase. Note that the end of a pulse of signal DLL_FALL will result in a pulse of DLL_LAT, which activates a transmission gate that drives the value of CLK_DELAYED, as described above.

In FIG. 12, the frequency of CLK_IN is sufficiently low. Therefore, pulses of DLL_RISE (e.g., in time period 1202) will coincide with intervals in which CLK_DELAYED has a value of logical 0. As described above, this will result in a CLK_OUT value of logical 1. On the other hand, pulses of DLL_FALL (e.g., in time period 1204) will coincide with intervals in which CLK_DELAYED has a value of logical 1. As described above, this will result in a CLK_OUT value of logical 0. Since CLK_DELAYED holds its value throughout the duration of DLL_RISE and DLL_FALL pulses, signal CLK_OUT transitions in response to a rising edge of DLL_RISE or DLL_FALL. This behavior results in a CLK_OUT signal that is substantially phase-aligned with signal CLK_IN. In other words, if t_lat is greater than t_delay, as illustrated in FIG. 3, then incorporating the invention advantageously does not alter the timing of CLK_OUT.

Figure 13:
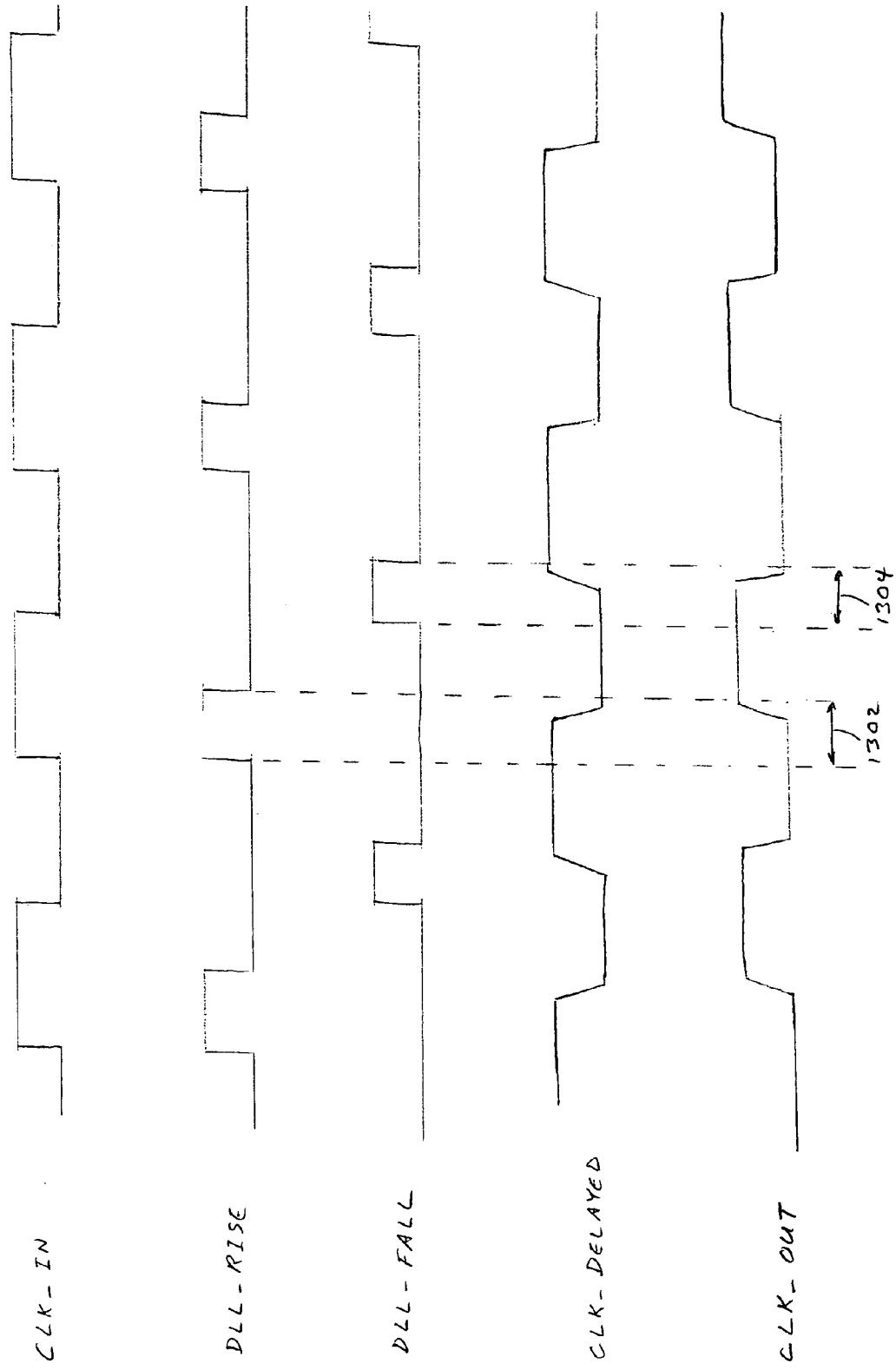
FIG. 13 is a timing diagram illustrating operation of the invention with a relatively high clock frequency.

FIG. 13 illustrates a scenario where the frequency of CLK_IN is relatively high. (Some signals that were shown in FIG. 12 have been omitted for clarity.) In this case, a rising edge of DLL_RISE coincides with a high value of CLK_DELAYED. Therefore, CLK_OUT simply remains low as a result of the rising edge of the DLL_RISE pulse. However, sometime during the DLL_RISE pulse (e.g., during time period 1302), CLK_DELAYED switches from high to low, causing CLK_OUT to switch from low to high. Similarly, the rising edge of a DLL_FALL pulse coincides with a low value of CLK_DELAYED, allowing CLK_OUT to remain high. However, during the DLL_FALL pulse (e.g., during time period 1304), CLK_DELAYED switches from low to high, causing CLK_OUT to switch from high to low. Thus, in contrast to the scenario shown in FIG. 12, the CLK_OUT transitions are not substantially aligned to rising edges of DLL_RISE and DLL_FALL. Rather, they are substantially aligned with transitions of CLK_DELAYED, which has been shifted from CLK_IN by a delay comparable to that of signal DATA. Therefore, as illustrated in FIG. 7, in scenarios where t_lat is less than t_delay, the invention delays signal CLK_OUT by an amount that preferably substantially aligns the phases of CLK_OUT and DATA. In particular, the alignment occurs in a way that satisfies the t first and t_last timing specifications, facilitating accurate data sampling at the memory controller.

Note that the embodiments described herein and shown are illustrative. The invention is applicable to other types of memories, devices, and circuits. For instance, t_delay can be created by a wide variety of circuitries other than those shown. One example involves the use of several processing stages, some coupled tightly to memory array 106 or 506, and some applied mostly as post-processing modules. Post-processing can include encoding, decoding, or other data manipulation. Similarly, DLL 110 can be replaced by another synchronization circuit, such as a phase-locked loop (PLL) or ring counter delay. In addition, the number of bits in the signal bus DATA can be different than that shown, as can the number of cycles in t_lat. For instance, t_lat can be set to 2.5*t_clk, so that CLK_OUT would ideally produce its first transition at a falling edge of CLK_IN.

Other embodiments can also be used for t_delay model 518 and clock output buffer 516. For instance, the transmission gates could be replaced by simple AND gates. Alternatively, the gates could be replaced with NAND gates while removing one inverter from the output chain of each gate. More generally, the polarity of many circuit elements could be reversed, along with the polarity of the incoming or outgoing signals if appropriate. Furthermore, instead of emulating the behavior of circuitry in the DATA path such as sense amp 512, t_delay model 518 could simply introduce a delay through a series of buffers. It can also include more complex logic that would allow flexible adjustment of its timing behavior. In fact, the invention need not be applied in the context of an SDRAM transmitting data to a memory controller. It can be used in any situation where timing skew is introduced by shortened clock periods or other causes.

Figure 14:
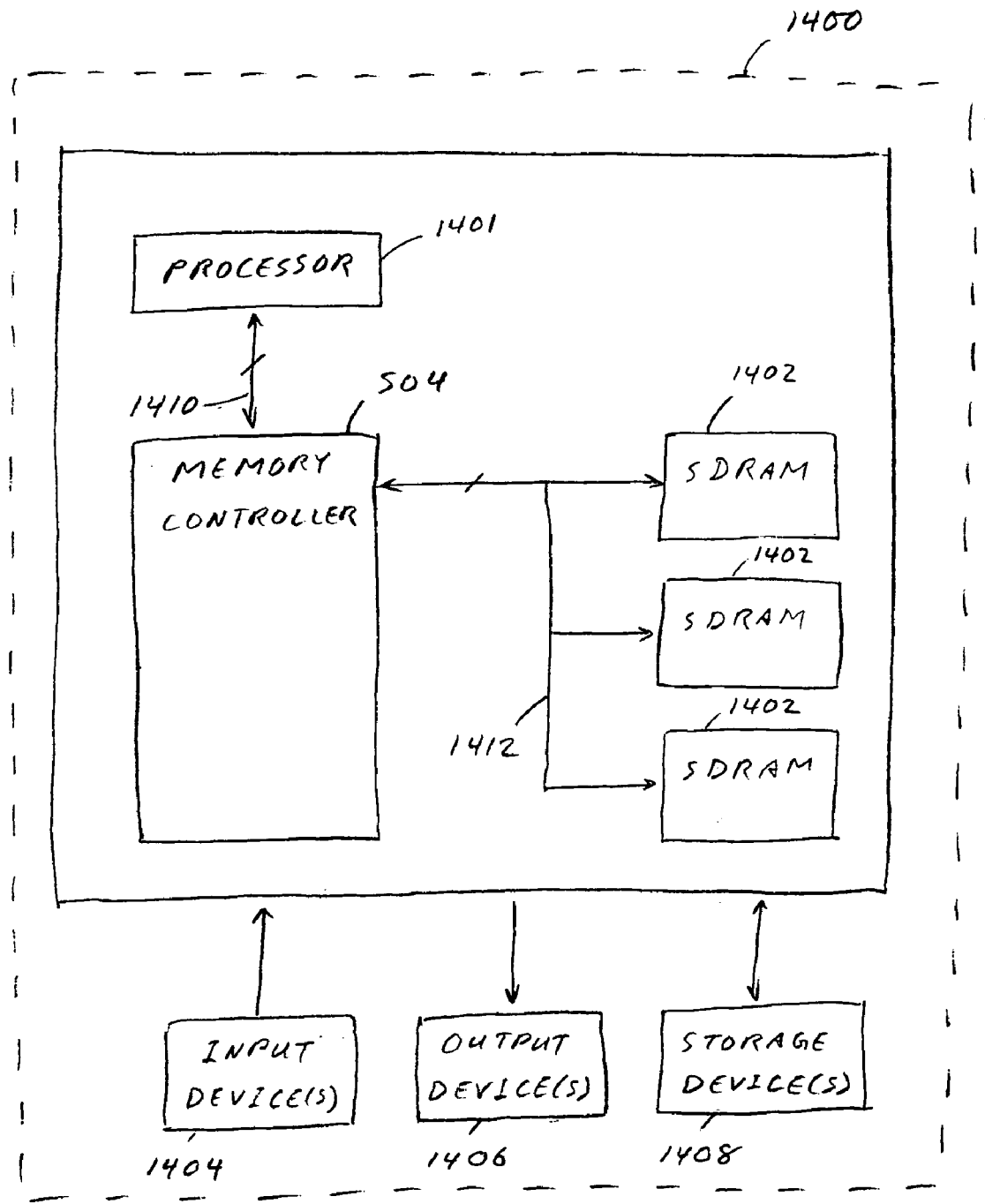
FIG. 14 is a block diagram of a system that incorporates the invention.

FIG. 14 shows a system that incorporates the invention. System 1400 includes a plurality of SDRAM chips 1402, a processor 1401, a memory controller 504, input devices 1404, output devices 1406, and optional storage devices 1408. SDRAM chips 1402 may be configured as either SDRAM 502 or 602 and may respectively include t_delay model 518 or t_delay model 520. Either t_delay model aligns the data and clock signals transferred to memory controller 504, shifting the clock signal when appropriate. Data and control signals are transferred between processor 1401 and memory controller 504 via bus 1410. Similarly, data and control signals are transferred between memory controller 504 and SDRAM chips 1402 via bus 1412. Input devices 1404 can include, for example, a keyboard, a mouse, a touch-pad display screen, or any other appropriate device that allows a user to enter information into system 1400. Output devices 1406 can include, for example, a video display unit, a printer, or any other appropriate device capable of providing output data to a user. Note that input devices 1404 and output devices 1406 can alternatively be a single input/output device. Storage devices 1408 can include, for example, one or more disk or tape drives.

Thus it is seen that circuits and methods are provided for aligning an output clock with associated data when the output clock period is relatively short. One skilled in the art will appreciate that the invention can be practiced by other than the described embodiments, which are presented for purposes of illustration and not of limitation, and the present invention is limited only by the claims which follow.

I claim:

1. A method of aligning a clock signal with a data signal in a memory device, said method comprising:
   receiving said clock signal;
   receiving a control signal;
   generating said data signal in response to said receiving said control signal; and
   delaying said clock signal when a delay of said clock signal through said memory device is less than a delay of said data signal through said memory device;
   whereby:
   transitions of said clock signal and said data signal exit said memory device substantially concurrently.

2. The method of claim 1 wherein said control signal is a read command signal.

3. The method of claim 1 wherein said delaying further comprises:
   delaying said clock signal by an amount substantially equal to the delay of data through voltage sense amplification circuitry.

4. The method of claim 1 wherein said delay of said data signal comprises a delay through a memory array and data sense amplification circuitry.

5. A circuit for aligning a received clock signal with a data signal in a memory device, said circuit comprising:
   delay circuitry for generating a delayed clock signal that is substantially out of phase with said received clock signal; and
   clock signal buffer circuitry coupled to said delay circuitry, said buffer circuitry generating an output signal whose transitions are responsive to transitions of said delayed clock signal when a delay of said received clock signal through said memory device is less than a delay of said data signal through said memory device.

6. The circuit of claim 5 further comprising a delay locked loop circuit operative to output said received clock signal and coupled to said clock signal buffer circuitry.

7. The circuit of claim 5 wherein said memory device comprises voltage sense amplification circuitry through which said data signal propagates.

8. The circuit of claim 7 wherein said delay circuitry comprises said voltage sense amplification circuitry.

9. The circuit of claim 5 wherein said memory device comprises data signal buffer circuitry operative to receive said received clock signal and to receive and output said data signal.

10. The circuit of claim 9 wherein said data signal is output from said data signal buffer circuitry in response to a transition of said received clock signal.

11. The circuit of claim 9 wherein the outputs of said data signal buffer circuitry and said clock signal buffer circuitry are coupled to a memory controller.

12. A system comprising:
    a processor;
    a memory controller;
    an input/output device;
    a dynamic random access memory device comprising an array of memory cells and a circuit for aligning a clock signal with a data signal when a delay of said clock signal through said memory device is less than a delay of said data signal through said memory device; and
    data and control signal busing coupled to said processor, to said memory controller, to said dynamic random access memory device, and to said input/output device.

13. The system of claim 12 wherein said memory device further comprises:
    delay circuitry coupled to receive said clock signal; and
    buffer circuitry coupled to receive an output signal of said delay circuitry.

14. A method of aligning a clock signal with a data signal in a memory device, said method comprising:
    receiving said clock signal;
    receiving a control signal;
    generating said data signal in response to said receiving said control signal;
    generating a delayed version of said clock signal; and
    generating an output signal whose transitions are responsive to transitions of said delayed version of said clock signal when a delay of said clock signal through said memory device is less than a delay of said data signal through said memory device.

15. The method of claim 14 wherein said delay of said data signal comprises a delay through a memory array.

16. The method of claim 15 wherein said delay of said data signal further comprises a delay through voltage sense amplification circuitry.

17. The method of claim 14 further comprising applying a latency to said clock signal when said clock signal delay is greater than said data signal delay.

18. The method of claim 17 wherein said latency is substantially equal to an integral multiple of a period of said clock signal.

19. The method of claim 17 wherein said latency is substantially equal to an integral multiple of half a period of said clock signal.

20. The method of claim 14 further comprising transmitting said output signal and said data signal to a memory controller.

21. A circuit for aligning a received clock signal with a data signal generated in a memory device, said circuit comprising:
    parasitic circuitry for delaying said received clock signal to generate a delayed clock signal that is substantially out of phase with said received clock signal; and
    combinational circuitry coupled to said parasitic circuitry, said combinational circuitry generating an output clock signal in response to transitions of said delayed clock signal.

22. The circuit of claim 21 wherein said parasitic circuitry comprises a capacitor.

23. The circuit of claim 21 wherein said transition circuitry comprises a transmission gate.

24. The circuit of claim 21 wherein said transition circuitry comprises a logic gate.

25. The circuit of claim 24 wherein said logic gate is a NAND gate.

26. The circuit of claim 21 wherein said combinational circuitry comprises:
    a PMOS transistor; and
    an NMOS transistor coupled to the PMOS transistor.

27. The circuit of claim 21 wherein said combinational circuitry is operative to receive an enable signal.

28. The circuit of claim 27 wherein said enable signal is a read command signal.

29. The circuit of claim 28 wherein an output of said circuit is undefined when said read command signal is not activated.

30. Apparatus for aligning a clock signal with a data signal in a memory device, said apparatus comprising;

means for receiving said clock signal;

means for receiving a control signal;

means for generating said data signal in response to receiving said control signal; and means for delaying said clock signal when a delay of said clock signal through said memory device is less than a delay of said data signal through said memory device, whereby transitions of said clock signal and said data signal exit said memory device substantially concurrently.

31. Apparatus for aligning a clock signal with a data signal in a memory device, said apparatus comprising:

delay means within said memory device for generating a delayed version of said clock signal; and buffer means coupled to said delay means, said buffer means generating an output signal whose transitions are responsive to transitions of said delayed version of said clock signal when a delay of said clock signal is less than a delay of said data signal.

* * * * *